United States Patent
Bin

(10) Patent No.: US 7,521,955 B2
(45) Date of Patent: Apr. 21, 2009

(54) METHOD AND SYSTEM FOR DEVICE CHARACTERIZATION WITH ARRAY AND DECODER

(75) Inventor: Gong Bin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/018,699

(22) Filed: Jan. 23, 2008

(65) Prior Publication Data

US 2008/0136437 A1 Jun. 12, 2008

Related U.S. Application Data

(63) Continuation of application No. 11/339,337, filed on Jan. 24, 2006, now Pat. No. 7,345,500.

(30) Foreign Application Priority Data

Dec. 22, 2005 (CN) .................. 2005 1 0111997

(51) Int. Cl.
G01R 31/26 (2006.01)
(52) U.S. Cl. .................. 324/769; 324/768; 324/522; 324/73.1
(58) Field of Classification Search .................. None
See application file for complete search history.

(56) References Cited

U.S. PATENT DOCUMENTS

| | | | |
|---|---|---|---|
| 3,870,953 A | 3/1975 | Boatman et al. | |
| 3,995,215 A * | 11/1976 | Chu et al. | 714/718 |
| 4,658,156 A * | 4/1987 | Hashimoto | 327/51 |
| 4,970,454 A * | 11/1990 | Stambaugh et al. | 324/73.1 |
| 4,972,144 A | 11/1990 | Lyon et al. | |
| 5,561,373 A | 10/1996 | Itoh | |
| 5,598,009 A | 1/1997 | Bui | |
| 5,703,381 A | 12/1997 | Iwasa et al. | |
| 5,986,293 A | 11/1999 | Suzuki et al. | |
| 6,281,696 B1 * | 8/2001 | Voogel | 324/765 |
| 6,313,658 B1 | 11/2001 | Farnworth et al. | |
| 6,489,798 B1 | 12/2002 | Scott-Thomas et al. | |
| 6,578,185 B1 | 6/2003 | Kelly | |
| 6,617,873 B2 | 9/2003 | Yokomizo | |
| 6,873,173 B2 | 3/2005 | Kollmer et al. | |
| 7,145,356 B2 | 12/2006 | Sang Gi | |
| 7,345,500 B2 * | 3/2008 | Bin | 324/769 |

OTHER PUBLICATIONS

Office Action mailed Sep. 5, 2006; U.S. Appl. No. 11/339,337.
Office Action mailed May 14, 2007; U.S. Appl. No. 11/339,337.

* cited by examiner

*Primary Examiner*—Vincent Q. Nguyen
*Assistant Examiner*—Thomas F. Valone
(74) *Attorney, Agent, or Firm*—Townsend and Townsend and Crew, LLP

(57) ABSTRACT

A system and method for testing devices. The system includes a plurality of pads and a decoder coupled to a plurality of devices. The decoder is configured to receive a plurality of selection signals from the plurality of pads and select a device from the plurality of devices based on at least information associated with the plurality of selection signals. Additionally, the system includes one or more pads connected to the selected device. At least one of the one or more pads is not connected to any of the plurality of devices other than the selected device. The one or more pads are used for testing the selected device.

9 Claims, 2 Drawing Sheets

METHOD AND SYSTEM FOR DEVICE CHARACTERIZATION WITH ARRAY AND DECODER

CROSS-REFERENCES TO RELATED APPLICATIONS

This application is a continuation to U.S. patent application Ser. No. 11/339,337, filed Jan. 24, 2006, entitled "Method and System for Device Characterization with Array Decoder" by inventor Gong Bin, which claims priority to Chinese Patent Application No. 200510111997.5, filed Dec. 22, 2005, entitled "Method and System for Device Characterization with Array and Decoder," by inventor Gong Bin, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits. More particularly, the invention provides a method and system for device characterization with array and decoder. Merely by way of example, the invention has been applied to testing MOS transistors. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is characterization of MOS transistors. The MOS transistors have various gate lengths and gate widths. Conventionally, each transistor is connected to at least one separate pad. For example, each transistor includes four terminals for the gate, the source, the drain, and the substrate respectively, and these four terminals are connected to four pads respectively. Different transistors do not share the same pads. Hence the pad area is much larger than the device area. The total area for the pad area and the device area can be too large.

From the above, it is seen that an improved technique for characterizing MOS transistors is desired.

BRIEF SUMMARY OF THE INVENTION

The present invention is directed to integrated circuits. More particularly, the invention provides a method and system for device characterization with array and decoder. Merely by way of example, the invention has been applied to testing MOS transistors. But it would be recognized that the invention has a much broader range of applicability.

In a specific embodiment, the invention provides a system for testing devices. The system includes a plurality of pads and a decoder coupled to a plurality of devices. The decoder is configured to receive a plurality of selection signals from the plurality of pads and select a device from the plurality of devices based on at least information associated with the plurality of selection signals. Additionally, the system includes one or more pads connected to the selected device. At least one of the one or more pads is not connected to any of the plurality of devices other than the selected device. The one or more pads are used for testing the selected device.

According to another embodiment, a system for testing transistors includes a plurality of pads and a decoder coupled to a plurality of transistors. The decoder is configured to receive a plurality of selection signals from the plurality of pads and select a transistor from the plurality of transistors based on at least information associated with the plurality of selection signals. Additionally, the system includes a first pad connected to a first terminal for the selected transistor, a second pad connected to a second terminal for the selected transistor, a third pad connected to a third terminal for the selected transistor, and a fourth pad connected to a fourth terminal for the selected transistor. The first pad is not connected to any of the plurality of transistors other than the selected transistor, and the second pad is not connected to any of the plurality of transistors other than the selected transistor. The first pad, the second pad, the third pad, and the fourth pad are used for testing the selected transistor.

According to yet another embodiment, the method for testing devices includes receiving a plurality of selection signals, processing information associated with the plurality of selection signals, and selecting a device from a plurality of devices based on at least information associated with the plurality of selection signals. The selected device is coupled to at least a control device. Additionally, the method includes generating a control signal associated with the selected device, receiving the control signal by the control device, connecting the selected device to at least one of one or more pads by the control device, and testing the selected device with the one or more pads.

Many benefits are achieved by way of the present invention over conventional techniques. Some embodiments of the present invention provide a testing mechanism that can significantly reduce the pad area and/or the total area. For example, the array includes 256 devices subject to testing. The average area for each device is about 100 $\mu m^2$. Each device uses only one pad for testing. Each pad area is about 6400 $\mu m^2$. In a conventional technique, the pad for each device is not shared with other devices. The pad area is about 98.5% of the total area. According to certain embodiments of the present invention, the total number of pads can be reduced from 256 to 9. The 9 pads include 8 selection pads and 1 test pad. Hence the total pad area is reduced by 96.5% in this example. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a method and system for device characterization with array and decoder. Merely by way of example, the invention has been applied to testing MOS transistors. But it would be recognized that the invention has a much broader range of applicability.

Figure 1:
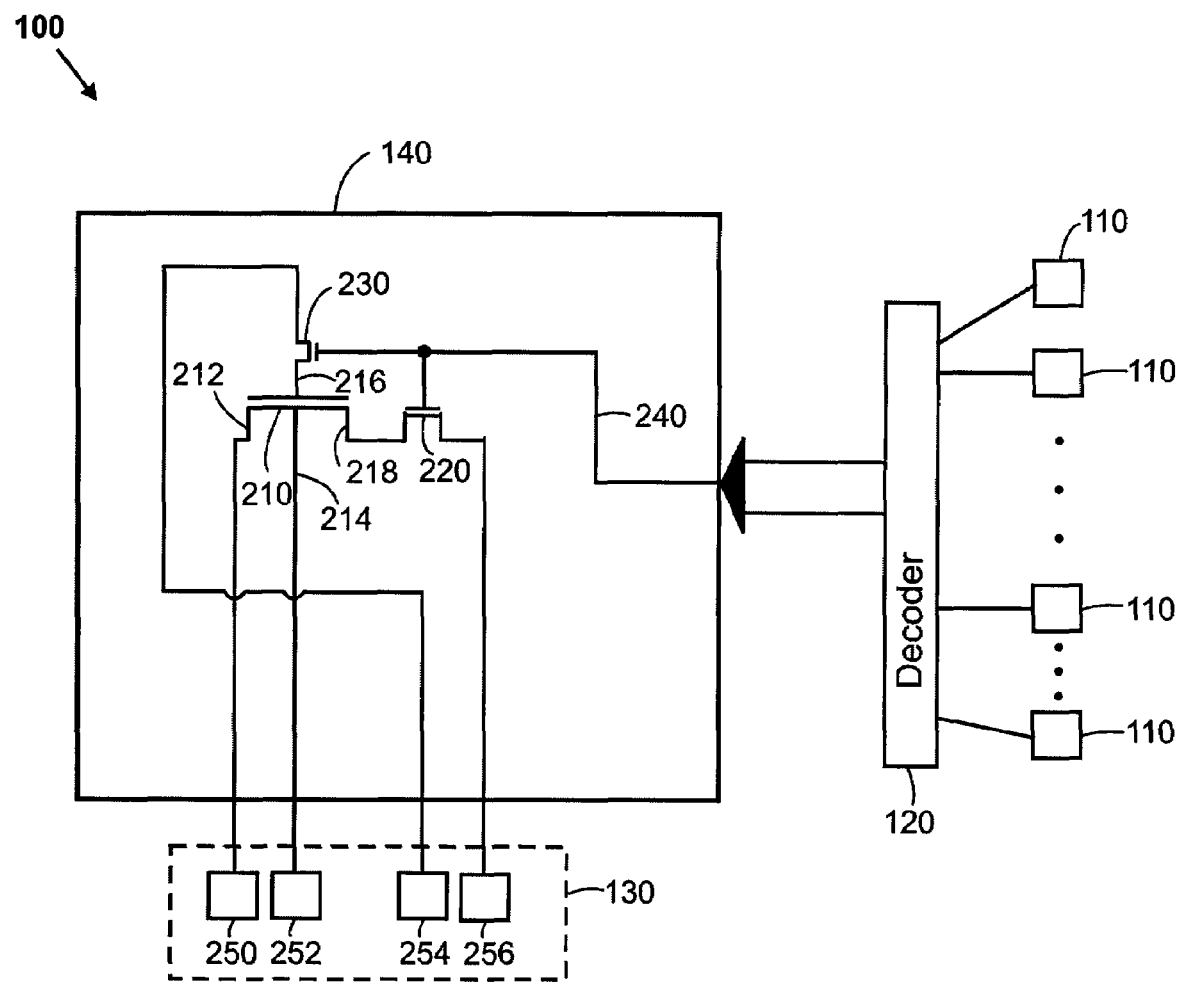
FIG. 1 is a simplified system for testing devices according to an embodiment of the present invention.

FIG. 1 is a simplified system for testing devices according to an embodiment of the present invention. This diagram is merely an example, which should not unduly limit the scope of the claims. One of ordinary skill in the art would recognize many variations, alternatives, and modifications. The system 100 includes the following components:
1. Selection pads 110;
2. Decoder 120;
3. Test pads 130.

Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The decoder 120 is coupled to an array 140 for devices subject to testing. The decoder 120 receives selection signals from the selection pads 110, and in response selects a device from the array 140. The selected device is connected to the test pads 130, and the other devices of the array 140 are not connected to all of the test pads 130. For example, the array 140 includes MOS transistors, and the selected MOS transistor has four terminals for the gate region, two source/drain regions, and the substrate region. Each terminal of the selected MOS transistor is connected to one of the test pads 130. The test pads 130 include four pads, each of which corresponds to a different terminal of the selected MOS transistor.

In one embodiment, the array 140 includes a plurality of MOS transistors subject to testing. One of the plurality of MOS transistors is a MOS transistor 210 including terminals 212, 214, 216, and 218. The test pads include pads 250, 252, 254, and 256. The pad 250 is connected to the terminal 212 for the source/drain region, and the pad 252 is connected to the terminal 214 for the substrate region. The terminal 216 for the gate region is connected to a control transistor 230, and the terminal 218 for the source/drain region is connected to a control transistor 220. The gates of the control transistors 220 and 230 each receive a control signal 240. For example, the transistor 210 is selected by the decoder 120 in response to selection signals received from the selection pads 110. In response, the control signal 240 turns on the control transistors 220 and 230. The terminal 216 for the gate region is connected to the pad 254, and the terminal 218 for the source/drain region is connected to the pad 256. In another example, the transistor 210 is not selected by the decoder 120 in response to selection signals received from the selection pads 110. In response, the control signal 240 turns off the control transistors 220 and 230. The terminal 216 for the gate region is not connected to the pad 254, and the terminal 218 for the source/drain region is not connected to the pad 256.

In another embodiment, the array 140 includes 256 devices subject to testing. The selection pads 110 include 8 pads for the decoder 120 to select one of the 256 devices on a binary basis. In yet another embodiment, the array 140 of devices is replaced by a plurality of devices that are not arranged in an array.

Figure 2:
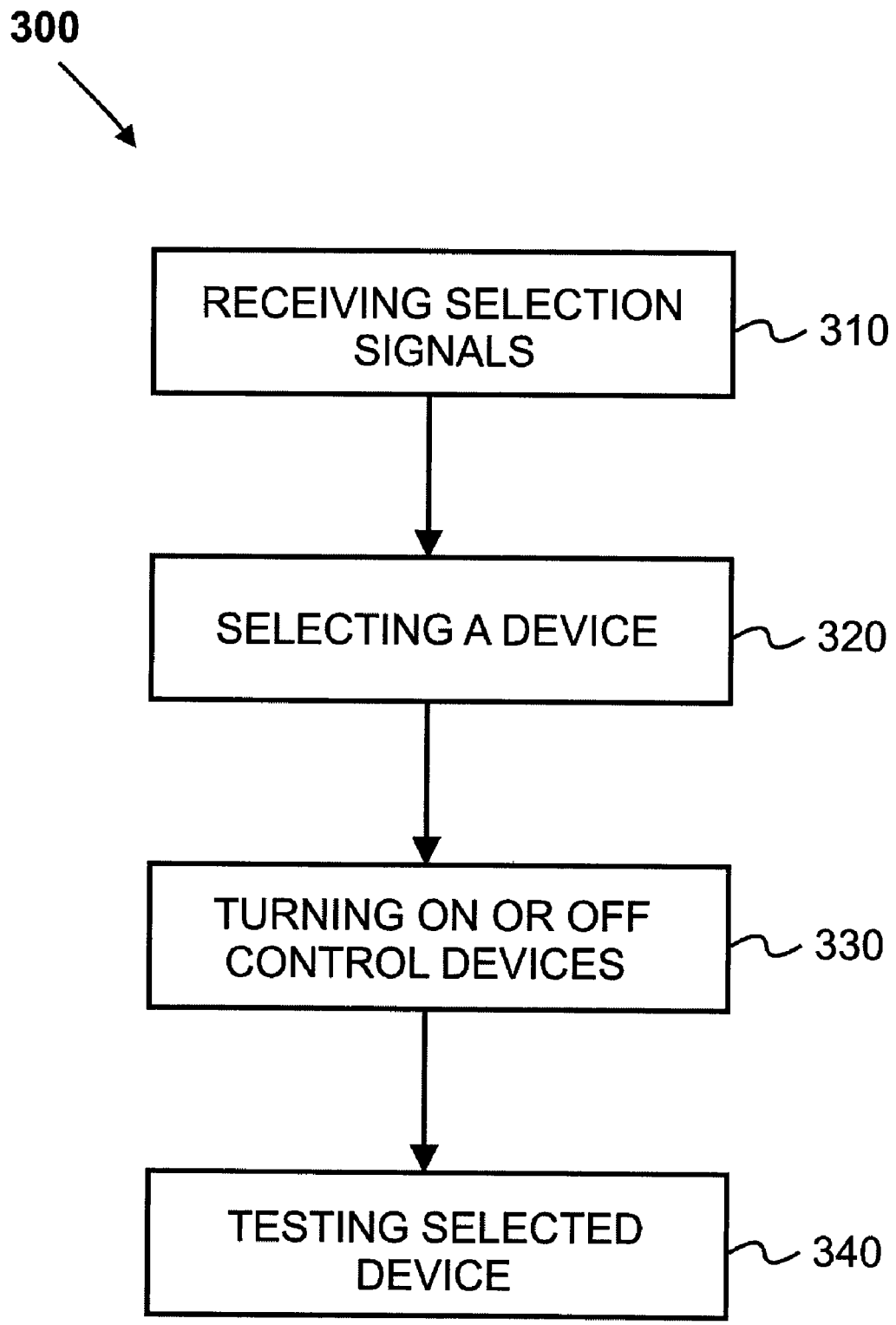
FIG. 2 is a simplified method for testing devices according to an embodiment of the present invention.

FIG. 2 is a simplified method for testing devices according to an embodiment of the present invention. This diagram is merely an example, which should not unduly limit the scope of the claims. One of ordinary skill in the art would recognize many variations, alternatives, and modifications. The method 300 includes the following processes:
1. Process 310 for receiving selection signals;
2. Process 320 for selecting a device;
3. Process 330 for turning on or off control devices;
4. Process 340 for testing selected device.

Although the above has been shown using a selected group of processes for the method 300, there can be many alternatives, modifications, and variations. For example, some of the processes may be expanded and/or combined. Other processes may be inserted to those noted above. For example, the method 300 is performed by the system 100. Depending upon the embodiment, the arrangement of processes may be interchanged with others replaced. Further details of these processes are found throughout the present specification and more particularly below.

At the process 310, selection signal are received. For example, the decoder 120 receives selection signals from the selection pads 110. At the process 320, a device is selected from a plurality of devices. For example, the device 210 is selected from the array 140, and the array 140 includes the plurality of devices subject to testing.

At the process 330, control devices for the plurality of devices are turned on or turned off. For example, the array 140 includes the plurality of devices subject to testing. Each of the plurality of devices corresponds to at least one control device. In one embodiment, if one of the plurality of devices is selected, the corresponding at least one control device is turned on in order to connect the selected device to the test pads 130. The control devices corresponding to the other devices of the plurality of devices are turned off in order to disconnect each of the unselected devices from at least one of the test pads 130.

For example, the transistor 210 is selected by the decoder 120 in response to selection signals received from the selection pads 110. In response, the control signal 240 turns on the control transistors 220 and 230. The terminal 216 for the gate region is connected to the pad 254, and the terminal 218 for the source/drain region is connected to the pad 256. In another example, the transistor 210 is not selected by the decoder 120 in response to selection signals received from the selection pads 110. In response, the control signal 240 turns off the control transistors 220 and 230. The terminal 216 for the gate region is not connected to the pad 254, and the terminal 218 for the source/drain region is not connected to the pad 256.

At the process 340, selected device is tested. In one embodiment, the selected device is the transistor 210. For example, the transistor 210 is tested to measure $I_{ds}$ as a function of $V_{gs}$, and/or $I_{ds}$ as a function of $V_{ds}$. $I_{ds}$ represents current between the two source/drain regions. $V_{gs}$ represents voltage drop between the gate region and the source/drain region that functions as the source. $V_{ds}$ represents voltage drop between the two source/drain regions. In another example, the transistor 210 is tested to measure the transistor threshold voltage $V_t$.

According to another embodiment, a system for testing devices includes a plurality of pads and a decoder coupled to a plurality of devices. The decoder is configured to receive a plurality of selection signals from the plurality of pads and select a device from the plurality of devices based on at least information associated with the plurality of selection signals. Additionally, the system includes one or more pads connected to the selected device. At least one of the one or more pads is not connected to any of the plurality of devices other than the selected device. The one or more pads are used for testing the selected device. For example, the system is implemented according to the system 100.

According to yet another embodiment, a system for testing transistors includes a plurality of pads and a decoder coupled to a plurality of transistors. The decoder is configured to receive a plurality of selection signals from the plurality of pads and select a transistor from the plurality of transistors based on at least information associated with the plurality of selection signals. Additionally, the system includes a first pad connected to a first terminal for the selected transistor, a second pad connected to a second terminal for the selected transistor, a third pad connected to a third terminal for the selected transistor, and a fourth pad connected to a fourth terminal for the selected transistor. The first pad is not connected to any of the plurality of transistors other than the selected transistor, and the second pad is not connected to any of the plurality of transistors other than the selected transistor. The first pad, the second pad, the third pad, and the fourth pad are used for testing the selected transistor. For example, the system is implemented according to the system 100.

According to yet another embodiment, the method for testing devices includes receiving a plurality of selection signals, processing information associated with the plurality of selection signals, and selecting a device from a plurality of devices based on at least information associated with the plurality of selection signals. The selected device is coupled to at least a control device. Additionally, the method includes generating a control signal associated with the selected device, receiving the control signal by the control device, connecting the selected device to at least one of one or more pads by the control device, and testing the selected device with the one or more pads. For example, the method is implemented according to the method 300.

The present invention has various applications. In one embodiment, the system 100 and/or the method 300 are used to characterize devices. In another embodiment, the system 100 and/or the method 300 are used to extract parameters for device modeling. For example, the array 140 includes a plurality of MOS transistors subject to testing. These MOS transistors are of the same type but with various gate lengths and gate widths. Each of these MOS transistors is individually selected and tested. The testing results are used to extract characteristic parameters, which can be used for device modeling and/or other purposes.

The present invention has various advantages. Some embodiments of the present invention provide a testing mechanism that can significantly reduce the pad area and/or the total area. For example, the array 140 includes 256 devices subject to testing. The average area for each device is about 100 µm². Each device uses only one pad for testing. Each pad area is about 6400 µm². In a conventional technique, the pad for each device is not shared with other devices. The pad area is about 98.5% of the total area. According to the system 100 and/or the method 300, the total number of pads can be reduced from 256 to 9. The 9 pads include 8 selection pads and 1 test pad. Hence the total pad area is reduced by 96.5%.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for testing transistors, the system comprising:
   a plurality of pads;
   a plurality of transistors including a first transistor, the first transistor including a first terminal, a second terminal, a third terminal, and a fourth terminal;
   a decoder coupled to the plurality of transistors and configured to receive a plurality of selection signals from the plurality of pads and select the first transistor from the plurality of transistors based on at least information associated with the plurality of selection signals, the decoder being adapted to generate a control signal based at least on the selection signals;
   a first pad coupled to the first terminal of the first transistor through a second transistor, the first terminal of the first transistor being either a source terminal or a drain terminal of the first transistor, the second transistor including a fourth, a fifth, and a sixth terminal, the sixth terminal being configured to receive the control signal from the decoder, the first pad being electrically coupled to at most one of the plurality of the transistors including the first transistor;
   a second pad coupled to the second terminal of the first transistor through a third transistor, the third transistor comprising a seventh terminal, a eighth terminal, and a ninth terminal, the second terminal of the second transistor being a gate terminal of the first transistor, the second pad being electrically connected to at most one of the plurality of the transistors including the first transistor;
   a third pad electrically connected to the third terminal of the first transistor, the third terminal being a substrate terminal of the first transistor; and
   a fourth pad electrically connected to the fourth terminal of the first transistor, the fourth terminal being the source terminal of the first transistor if the first terminal is the drain terminal of the first transistor, or the drain terminal of the first transistor if the first terminal is the source terminal of the first transistor.

2. The system of claim 1 wherein:
   the sixth terminal is a gate terminal of the second transistor;
   the ninth terminal is a gate terminal of the third transistor;
   the fourth terminal and the fifth terminal of the second transistor are either a source terminal or a drain terminal of the second transistor, the fourth terminal being the drain terminal of the second transistor if the fifth terminal is the source terminal of the second transistor and the fourth terminal being the source terminal of the second transistor if the fifth terminal is the drain terminal of the second transistor; and
   the seventh terminal and the eighth terminal of the third transistor are either a source terminal or drain terminal of the third transistor, the seventh terminal being the drain terminal of the third transistor if the eighth terminal is the source terminal of the third transistor and the seventh terminal being the source terminal of the third transistor if the eighth terminal is the drain terminal of the third transistor.

3. The system of claim 1 wherein:

the first pad is coupled to the first terminal of the first transistor further through an electrical connection between the first pad and the fourth terminal of the second transistor and an electrical connection between the fifth terminal of the second transistor and the first terminal of the first transistor; and the second pad is coupled to the second terminal of the first transistor further through an electrical connection between the second pad and the seventh terminal of the third transistor and an electrical connection between the eighth terminal of the third transistor and the second terminal of the first transistor.

4. The system of claim 2 wherein the sixth terminal of the second transistor and the ninth terminal of the third transistor are electrically connected, and the ninth terminal of the third transistor is adapted to receive the control signal from the decoder to select the first transistor for testing.

5. The system of claim 1 is further adapted for testing transistors wherein the plurality of transistors is arranged in an array.

6. The system of claim 1 wherein the plurality of selection signals includes an N number of signals, the control signal being capable of selecting the first transistor from up to $2^N$ number of transistors.

7. The system of claim 6 wherein N is 8 and the plurality of transistors consists of 256 transistors.

8. The system of claim 1 wherein the plurality of transistors and MOS transistors.

9. The system of claim 1 wherein the control signal selects one transistor at a time for testing.

* * * * *